United States Patent
Alvarez

(10) Patent No.: US 9,085,051 B2
(45) Date of Patent: Jul. 21, 2015

(54) FLUORINATED SILVER PASTE FOR FORMING ELECTRICAL CONNECTIONS IN HIGHLY DIELECTRIC FILMS, AND RELATED PRODUCTS AND METHODS

(75) Inventor: Jemssy Alvarez, Gregory, MI (US)

(73) Assignee: Gaurdian Industries Corp., Auburn Hills, MI (US)

( * ) Notice: Subject to any disclaimer, the term of this patent is extended or adjusted under 35 U.S.C. 154(b) by 957 days.

(21) Appl. No.: 12/662,047

(22) Filed: Mar. 29, 2010

(65) Prior Publication Data
US 2011/0233481 A1  Sep. 29, 2011

(51) Int. Cl.
| | | |
|---|---|---|
| H01B 1/00 | (2006.01) | |
| H01B 1/12 | (2006.01) | |
| B23K 35/36 | (2006.01) | |
| B23K 35/30 | (2006.01) | |
| H05B 3/86 | (2006.01) | |
| H05K 1/09 | (2006.01) | |
| H01B 1/02 | (2006.01) | |
| H01B 1/22 | (2006.01) | |
| B05D 5/06 | (2006.01) | |
| C03C 17/00 | (2006.01) | |
| G02B 1/10 | (2006.01) | |
| B60L 1/02 | (2006.01) | |
| H05K 3/40 | (2006.01) | |

(52) U.S. Cl.
CPC .............. *B23K 35/36* (2013.01); *B23K 35/3006* (2013.01); *B23K 35/3605* (2013.01); *H05B 3/86* (2013.01); *H05K 1/092* (2013.01); *H05B 2203/016* (2013.01); *H05K 3/4007* (2013.01); *H05K 3/4061* (2013.01); *H05K 2201/0209* (2013.01)

(58) Field of Classification Search
USPC ........... 148/26, 40, 24; 252/182.33, 500, 514; 427/447, 163.1; 219/203
See application file for complete search history.

(56) References Cited

U.S. PATENT DOCUMENTS

| 4,623,582 A | 11/1986 | Hasegawa et al. | |
|---|---|---|---|
| 4,941,929 A * | 7/1990 | Tecle | 148/24 |
| 5,069,968 A | 12/1991 | Nietering | |
| 5,229,205 A | 7/1993 | Nietering | |
| 5,506,037 A | 4/1996 | Termath | |
| 6,268,594 B1 * | 7/2001 | Leutner et al. | 219/522 |
| 6,625,875 B2 * | 9/2003 | Sol | 29/621 |
| 2005/0072974 A1 * | 4/2005 | Nakamura et al. | 257/59 |

(Continued)

FOREIGN PATENT DOCUMENTS

EP  1 488 972  12/2004

OTHER PUBLICATIONS

U.S. Appl. No. 10/956,371, Odeh, filed Apr. 20, 2006.
(Continued)

*Primary Examiner* — Bijan Ahvazi
(74) *Attorney, Agent, or Firm* — Nixon & Vanderhye P.C.

(57) ABSTRACT

Certain example embodiments of this invention relate to silver pastes that are capable of making an electrical connection with at least one conductive layer in a layer stack, even where the at least one conductive layer is protected by one or more strong dielectric layers, and/or methods of making the same. Certain example embodiments include a chemically modified silver paste that may be cured or fired using a standard glass tempering furnace (e.g., an electrical or gas-fuelled furnace) or a short-wave infrared heating process at temperatures below 750 degrees C. In certain example embodiments, the fluorine causes apertures or micro-factures in the dielectric layer(s), which allows the silver in the paste to move therethrough (e.g., by capillary action) to form a contact with the conductive layer(s).

17 Claims, 2 Drawing Sheets

(56) References Cited

U.S. PATENT DOCUMENTS

2005/0112291 A1* 5/2005 Okajima et al. .............. 427/447
2006/0154425 A1* 7/2006 Yang et al. .................... 438/287

OTHER PUBLICATIONS

U.S. Appl. No. 12/458,071, Cooper et al., filed Jun. 30, 2009.
U.S. Appl. No. 12/458,111, Cooper, filed Jun. 30, 2009.
U.S. Appl. No. 12/230,033, Lingle et al., filed Aug. 21, 2008.
U.S. Appl. No. 12/230,034, Wang et al., filed Aug. 21, 2008.
U.S. Appl. No. 12/289,921, den Boer et al., filed Nov. 6, 2008.
U.S. Appl. No. 12/379,382, Thomsen et al., filed Feb. 19, 2009.
U.S. Appl. No. 12/458,791, Thomsen et al., filed Jul. 22, 2009.
U.S. Appl. No. 12/458,790, Thomsen et al., filed Jul. 22, 2009.
U.S. Appl. No. 12/591,061, Krasnov, filed Nov. 5, 2009.

* cited by examiner

US 9,085,051 B2

FLUORINATED SILVER PASTE FOR FORMING ELECTRICAL CONNECTIONS IN HIGHLY DIELECTRIC FILMS, AND RELATED PRODUCTS AND METHODS

FIELD OF THE INVENTION

Certain example embodiments of this invention relate to silver pastes, and/or methods of making the same. More particularly, certain example embodiments of this invention relate to silver pastes that are capable of making an electrical connection with at least one conductive layer in a layer stack, even where the at least one conductive layer is protected by one or more strong dielectric layers, and/or methods of making the same. Certain example embodiments include a chemically modified silver paste that may be cured or fired using a standard glass tempering furnace (e.g., an electrical or gas-fuelled furnace) or a short-wave infrared heating process at temperatures below 750 degrees C.

BACKGROUND AND SUMMARY OF EXAMPLE EMBODIMENTS OF THE INVENTION

Silver pastes are commonly used to form electrical connections with metal conductive layers. See, for example, application Ser. Nos. 10/956,371; 12/458,071; and 12/458,111, and U.S. Pat. No. 4,941,929, which references describe example silver frits/pastes and are hereby incorporated by reference herein in their entireties. Such silver pastes may be useful in connection with a wide variety of applications including, for example, refrigerator and/or freezer doors, oven doors, vehicle windshields, photovoltaic devices, plasma display panels (PDPs) and other electronic devices, and/or the like.

The silver paste typically is made to penetrate the top layer (or layers) of oxidized or ceramic films so as to come into contact with a metallic conductive layer(s). Unfortunately, however, silver pastes are not always able to penetrate the topmost layer (or layers) of all thin film coatings to reach the metallic conductive layer(s), particularly in cases where the layer (or layers) provided over the metallic conductive layer(s) are very strong dielectrics. For instance, when the design of the coating stack includes top layers of transitional elements or compounds including, for example, Zirconium, Scandium, Titanium, Vanadium, Yttrium, Niobium, Lanthanum, Hafnium, and/or Tantalum, highly dielectric films with high surface strengths may be created. Standard silver pastes commercially used in the market today often will not penetrate these highly dielectric films and thus will not create an electrical contact to the metal current-transmitting layers within the coating stack design.

A side-by-side comparison was performed by applying Ag-based bus bars on a PPII HT coating with and without a $ZrO_2$ overcoat. Samples with the $ZrO_2$ overcoat generated arcing and hot spots at low powers, whereas samples with no $ZrO_2$ overcoat produced good results and were capable of carrying "standard" power levels (e.g., 24 VAC for a 5 ohm coating) for a long period of time without breaking down. In this case the glass temperature was reported to be about 150 degrees F.

In part because of the poor or non-existent connection formed between the silver paste and the conductive layers (which causes a higher electrical resistance), a higher voltage must be provided. Unfortunately, however, providing a higher voltage may result in excess or otherwise undesirable localized heating at the contact interface and sometimes even in "blowout or electrical leakage" of the connection. The high voltages that cause these problems may be provided intentionally or during voltage surges, but the blowout problem may be common to both situations.

Thus, it will be appreciated that there is a need in the art for an improved frit paste that is capable of making an electrical connection with at least one conductive layer in a layer stack, even where the at least one conductive layer is protected by one or more strong dielectric layers, and/or methods of making the same. It also will be appreciated that there is a need in the art for an improved frit paste that is capable of surviving voltage surges.

One aspect of certain example embodiments relates to a chemically modified silver paste that is capable of forming an electrical connection with at least one conductive layer in a layer stack, even where the at least one conductive layer is protected by one or more strong dielectric layers (such as, for example, Zirconium or the like).

Another aspect of certain example embodiments relates to a chemically modified silver paste that includes tin fluoride. In certain example embodiments, the tin fluoride concentration or amount is less than 10.0% by weight, more preferably between 0.2-6.0% by weight.

Still another aspect of certain example embodiments relates to a silver paste that is capable of surviving voltage surges.

Yet another aspect of certain example embodiments relates to a silver paste that involves forming an electrical connection with at least one conductive layer in a layer stack, even where the at least one conductive layer is protected by one or more strong dielectric layers, without needing to equipment or processing changes to the normal manufacturing process in place at fabricators worldwide.

In certain example embodiments of this invention, a method of making a product comprising a coating supported by a glass substrate is provided. The substrate supporting the coating is provided, with the coating comprising a plurality of thin film layers including at least one dielectric layer and at least one conductive layer located between the at least one dielectric layer and the substrate. A silver paste is provided on the coating, with the silver paste being at least initially fluorinated. At least the fluorinated silver paste is heated. An electrical connection is formed between the at least one conductive layer and the silver paste. According to certain example embodiments, the product may be an electronic device; refrigerator, freezer, or oven door; vehicle windshield; etc.

In certain example embodiments of this invention, a method of making a fluorinated silver paste is provided. A silver paste is provided. Tin fluoride is added to the silver paste. The amount of tin fluoride in the fluorinated silver paste is less than 10% by weight. The concentration of fluorine in the tin fluoride is less than 1%.

In certain example embodiments of this invention, a fluorinated silver paste is provided. The fluorinated silver paste comprises a silver paste and tin fluoride. The amount of tin fluoride in the fluorinated silver paste is less than 10% by weight, the concentration of fluorine in the tin fluoride is less than 1%, and a temperature required for baking the fluorinated silver paste is substantially the same as the temperature would be for the initially provided silver paste.

The features, aspects, advantages, and example embodiments described herein may be combined to realize yet further embodiments.

BRIEF DESCRIPTION OF THE DRAWINGS

These and other features and advantages may be better and more completely understood by reference to the following detailed description of exemplary illustrative embodiments in conjunction with the drawings, of which.

DETAILED DESCRIPTION OF EXAMPLE EMBODIMENTS OF THE INVENTION

As indicated above, at least some standard silver frit pastes commercially available from suppliers in the marketplace today will not penetrate highly dielectric films and therefore will not form a good contact with metal layers within a layer stack. The silver paste conventionally is applied to the surface of the glass and then heated or fired in a standard tempering furnace. Ideally, the silver paste will move using capillary forces from the top layer though the stack and ultimately will make a firm and durable contact with the silver or other metallic layers in the stack, yielding a low resistivity measurement. However, when films made of oxide compounds of Zirconium, Scandium, Titanium, Vanadium, Yttrium, Niobium, Lanthanum, Hafnium, Tantalum, and/or the like are used as top layers in the stack, they tend to create highly dielectric films. Accordingly, when the standard silver paste is heated or fired, limited intermixing action takes place through the overlaying dielectrical layers, yielding resistivity measurements that are unusable for commercial, residential, interior, refrigeration, energy, and electronic applications. In addition, when power is applied, the higher contact resistance affects the electrical conductivity, which requires higher power levels. In a short period of time, the elevated power levels cause the limited connection points to overheat and blow, becoming unusable. The end result is an open circuit and little to no electrical conductance.

Figure 1:
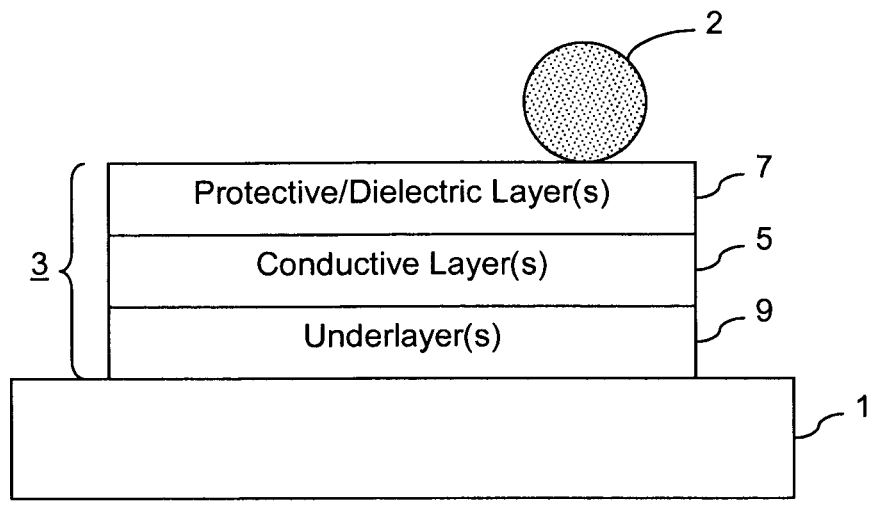
FIG. 1 is a cross-sectional view that helps demonstrate a problem with certain conventional silver pastes.

This problem is demonstrated in FIG. 1, which is a cross-sectional view that helps demonstrate a problem with certain conventional silver pastes. The substrate 1 supports a multi-layer thin film coating 3. The coating 3 comprises at least one conductive layer 5, sandwiched between one or more underlayers 9 and one or more protective and/or dielectric layers 7. A conventional silver frit 2 is provided on the coating 3. However, even after heating, the silver in the paste does not contact the at least one conductive layer 5, resulting in an open circuit and little to no electrical conductance.

By chemically modifying the standard silver paste with small amounts of tin fluoride (e.g., $SnF_2$ or other suitable stoichiometry), however, the above-described connectivity problems are reduced and sometimes even eliminated. This improvement results because, when heated or fired, the tin fluoride particles dissolve small areas of the highly dielectric film and create small apertures in the surface of the oxided Zirconium, Scandium, Titanium, Vanadium, Yttrium, Niobium, Lanthanum, Hafnium, or Tantalum. The silver moves via a capillary motion through these microscopic apertures and bonds to the other metal layers in the coating stack, thereby creating a stable electrically conductive path. The characteristics of the apertures or micro-fractures may vary in different embodiments of this invention. For instance, in certain example embodiments, the apertures or micro-fractures may be any or all of microscopic holes, slits, slots, and/or the like.

In other words, the fluorinated silver paste of certain example embodiments is capable of working through and/or dissolve Zr and/or other similar layers to allow an electrical connection to be formed. Advantageously, this forms a reliable connection between the chemically modified silver paste of certain example embodiments and the conductive layer(s).

Figure 2:
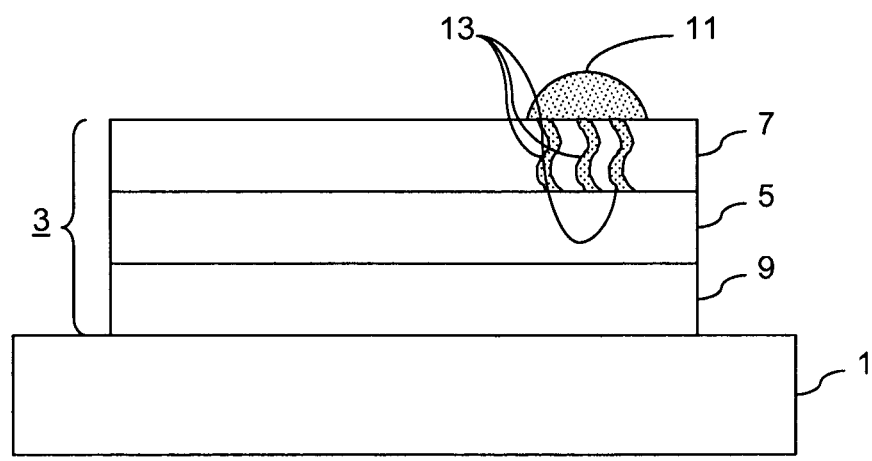
FIG. 2 is a cross-sectional view that helps demonstrate how the fluorinated silver pastes of certain example embodiments function.

FIG. 2 is a cross-sectional view that helps demonstrate how the fluorinated silver pastes of certain example embodiments function. The substrate 1 and the coating 3 in FIG. 2 are the same as those shown in FIG. 1. However, the fluorine provided in the improved fluorinated silver paste 11 helps form apertures or micro-fractures 13. When exposed to heat (e.g., baked, thermally tempered, and/or the like), at least some of the silver in the silver paste may migrate through these apertures or micro-fractures 13 (e.g., by capillary action), thereby forming a reliable connection. It will be appreciated that the apertures or micro-fractures 13 are stylized depictions and that more or fewer of these and/or differently shaped apertures or micro-fractures might ultimately be formed.

Certain example embodiments include the mixing of silver paste with a tin fluoride (e.g., $SnF_2$) component. In certain example embodiments, the tin fluoride concentration or amount is less than 10% by weight, more preferably between 0.2-6% by weight. The concentration or amount of tin fluoride to silver paste may be less than 5% by volume in certain example embodiments. The material is ground to fine particles using a less than about 400 mesh and mixed into the silver paste. Certain examples have been tested, and results have indicated that (1) the firing temperature was lower with the tin fluoride additive, and (2) the fired paste produced much more consistent electrical contacts. This was true even where layer stack systems with strong dielectrics were created. The contact including the tin fluoride component advantageously was able to withstand almost double the voltage surge as compared to conventional silver paste, and it has provided a reliable contact for continuous current.

As alluded to above, during the heating process, the silver in the paste migrates through the small apertures or micro-fractures that are formed by virtue of the tin fluoride, etc., via capillary forces and fuses with conductive layer (e.g., silver or the like) in coating stack to form an electrical connection. Although one might expect the introduction of tin fluoride into the silver paste to require an increase the firing temperature (e.g., because more energy would be needed to melt the frit), certain example embodiments advantageously do not require a change to the firing temperature which, in turn, can reduce (and sometimes even eliminate) the need for equipment or processing changes to the normal manufacturing process in place at fabricators worldwide.

Advantageously, the fluorine has been found to diffuse and/or be absorbed into the coating stack, and/or "bake out." In certain example embodiments, the silver paste will be substantially free from fluorine after firing. In some instances, certain example embodiments will lack any measurable fluorine in the silver paste after firing.

A first set of experiments tested a frit used for automotive application when attaching bus bars to windshields. The frit used in this set of experiments was BASF A6174LE for 80% silver lead free. Screening was performed on Guardian's Neutral 70 (N70) coating with formulations that were un-doped, as well as formulations that included a paste doped with SnF2 powder at 0.2% and 0.4% concentrations. It is noted that N70 is a 14-15 ohm/sq. coating. The results of these experiments are presented in the following table.

| SnF2 Concentration | Box Furnace: 675 C.; 30 min | Belt Furnace; 625 C.; 5 in/min |
|---|---|---|
| 0.00% | 10k ohm | 20 ohm |
| 0.20% | 0.9M ohm | 14 ohm |
| 0.40% | 10k ohm | 13 ohm |

To validate this first set of experiments, a N70 samples with a thicker ZrO2 layer were used for this experiment (70A vs. the standard 50A). Sample size was approximately 13"×20" by 4 mm. Bus bars were applied by hand using a standard silk-screen process (80 mesh) on the 13" side, and the bus bars were about 6-8 mm wide. Samples were subsequently tempered at about 240 in./min with a continuous radiative furnace. The temperature set point was 780 degrees C. The samples were inspected optically, and the contact resistance was measured with a DC probe. Selected samples were powered by an AC adjustable source (variac). The results of this second set of experiments are presented in the table that follows.

| Sample ID | SnF2 Concentration | 2-point resistance (ohm/sq.) | Max VAC before breakdown |
|---|---|---|---|
| 1-1 | 0.00% | 22.4 | 20 |
| 1-2 | 0.00% | 17 | 18 |
| 1-3 | 0.00% | 16.8 | |
| 1-4 | 0.00% | 16 | |
| 2-1 | 0.40% | 16.2 | 48 |
| 2-2 | 0.40% | 16.1 | |
| 2-3 | 0.40% | 16.2 | |
| 2-4 | 0.40% | 16.1 | |
| 2-5 | 0.40% | 16.2 | |
| 3-1 | 0.20% | 16.4 | 34 |
| 3-2 | 0.20% | 16.1 | |
| 3-3 | 0.20% | 16.3 | |
| 3-4 | 0.20% | 16.2 | |

Samples were tempered on the hotter side, meaning that the results in the table above are representative of the extreme for over-heated conditions. This was indicated by: overall glass quality and defect post tempering, as well as by the unusually high sheet resistance for this coating, which was expected to be closer to 14 ohms/square as opposed to 16 ohms/square. In any event, these results demonstrate that the addition of small amounts of SnF2 to the base frit provided a conductive path through the insulating ZrO2 layer. In general, <1% concentration is desirable for certain example embodiments. A concentration range of 0.1%-0.5% is preferred, and a concentration of 0.2%-0.4% is more preferred. In certain example instances, 0.2% concentration or 0.4% concentration may be particularly desirable.

Any number of commercially available silver pastes may be chemically modified to be suitable for use in connection with the example embodiments described herein. For instance, Ferro's silver pastes for photovoltaic applications (including, for example, commercially available products in one or more of the following lines: thick film silver conductor inks; silver/aluminum, silver back surface thick film conductor inks; lead-free silver inks; hot melt silver conductor inks; and/or thin film materials; etc.), Dupont's Solamet PV 173 Photovoltaic Metallization Paste, and/or Johnson Matthey silver paste products for automotive applications, may be modified for use with certain example embodiments.

Figure 3:
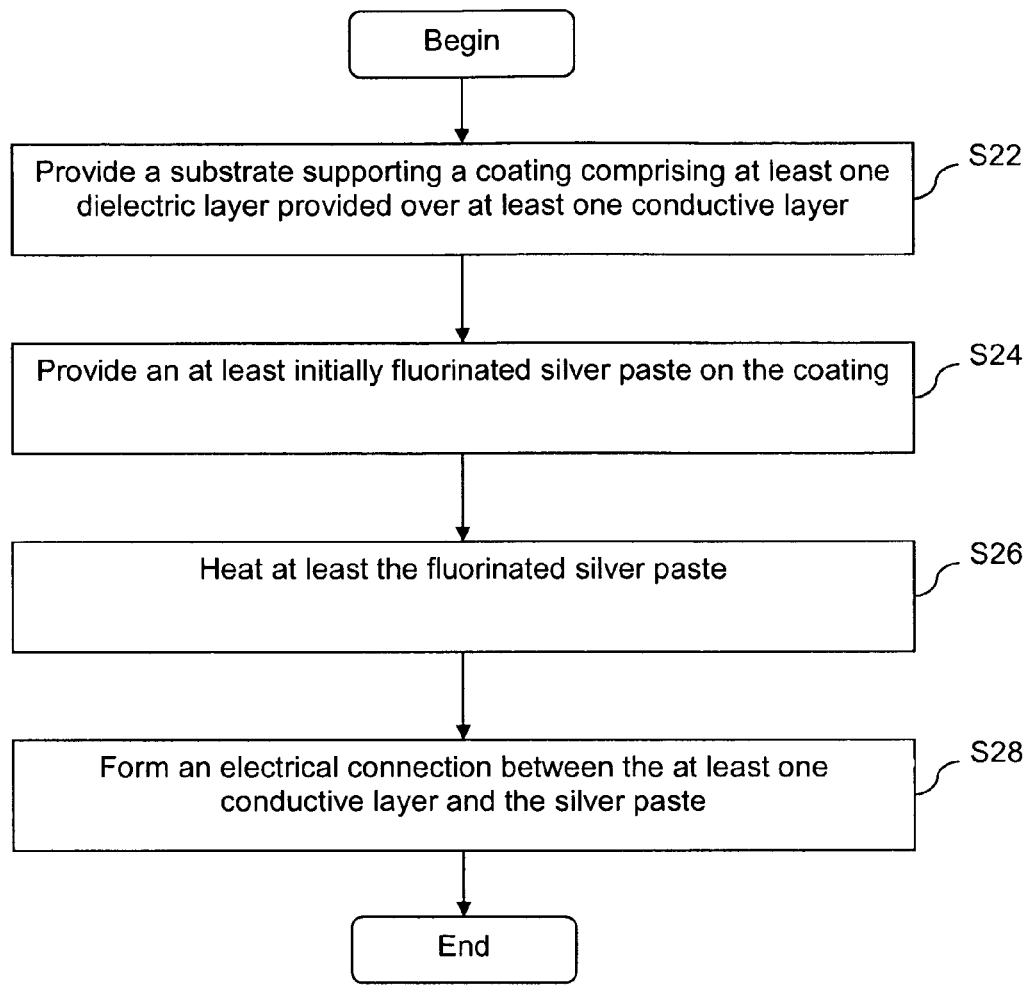
FIG. 3 is a flowchart illustrating an example process for making a product including an electronic connection in accordance with an example embodiment of this invention.

FIG. 3 is a flowchart illustrating an example process for making a product including an electronic connection in accordance with an example embodiment of this invention. A substrate supporting a coating is provided in step S22, with the coating comprising a plurality of thin film layers including at least one dielectric layer and at least one conductive layer located between the at least one dielectric layer and the substrate. A silver paste is provided on the coating in step S24, with the silver paste being at least initially fluorinated. The silver paste may be provided on and in direct contact with the coating in certain example embodiments of this invention, e.g., at or near the periphery of the substrate, depending on the desired application. In step S26, at least the fluorinated silver paste is heated or baked (e.g., using a box furnace, belt furnace, short wave IR burner, or other appropriate means). In step S28, an electrical connection is formed between the at least one conductive layer and the silver paste. Optionally, bus bars that connect with the electrical connection may be formed in certain example embodiments.

The product may be an electronic device; refrigerator, freezer, or oven door; vehicle windshield; etc., depending on the example embodiment. See, for instance, application Ser. Nos. 12/230,033; 12/230,034; 12/289,921; 12/379,382; 12/458,791; 12/458,790; and 12/591,061, the entire contents of each of which are hereby incorporated herein by reference.

In certain example embodiments, the fluorinated silver paste may be lead-free or substantially lead-free. Certain example fluorinated silver pastes may contain less than 20% Pb by weight, whereas others may contain less than 10% Pb by weight, still others may contain less than 5% by weight, and still others may contain 0-1% Pb by weight.

As used herein, the terms "on," "supported by," and the like should not be interpreted to mean that two elements are directly adjacent to one another unless explicitly stated. In other words, a first layer may be said to be "on" or "supported by" a second layer, even if there are one or more layers therebetween.

While the invention has been described in connection with what is presently considered to be the most practical and preferred embodiment, it is to be understood that the invention is not to be limited to the disclosed embodiment, but on the contrary, is intended to cover various modifications and equivalent arrangements included within the spirit and scope of the appended claims.

What is claimed is:

1. A method of making a product comprising a coating supported by a glass substrate, the method comprising:
    providing the substrate supporting the coating, the coating comprising a plurality of thin film layers including at least one dielectric layer and at least one conductive layer located between the at least one dielectric layer and the substrate, wherein the dielectric layer comprises zirconium oxide;
    providing a silver paste on the coating over the dielectric layer comprising zirconium oxide, the silver paste being at least initially fluorinated;
    heating at least the fluorinated silver paste;
    forming an electrical connection between the at least one conductive layer and the silver paste, wherein there is no electrical connection between the silver paste and the at least one conductive layer prior to said heating, wherein the heating causes fluorine at least initially provided to the silver paste to form apertures or micro-fractures in the at least one dielectric layer comprising zirconium oxide in forming the electrical connection; and
    wherein the product is a refrigerator door, freezer door, or oven door.

2. The method of claim 1, wherein the silver paste is at least initially fluorinated with tin fluoride, the amount of tin fluoride in the fluorinated silver paste when initially provided on the coating being less than 10% by weight.

3. The method of claim 2, wherein the concentration of fluorine in the tin fluoride is less than 1% by weight.

4. The method of claim 2, wherein the concentration of fluorine in the tin fluoride is about 0.2-0.4% by weight.

5. The method of claim 1, wherein the silver paste is at least initially fluorinated with tin fluoride, the amount of tin fluoride in the fluorinated silver paste when initially provided on the coating being 4-6% by weight.

6. The method of claim 1, wherein there is no detectable fluorine in the silver paste after the heating.

7. The method of claim 1, wherein a temperature required for the heating of the fluorinated silver paste is substantially the same as the temperature would be for an otherwise identical non-fluorinated silver paste.

8. The method of claim 1, wherein at least one said conductive layer comprises Ag.

9. The method of claim 1, further comprising connecting a bus bar to the electrical connection.

10. A method of making a product comprising a coating supported by a glass substrate, the method comprising:
   providing the substrate supporting the coating, the coating comprising a plurality of thin film layers including at least one dielectric layer and at least one conductive layer located between the at least one dielectric layer and the substrate, wherein the dielectric layer comprises zirconium oxide;
   providing a silver paste on the coating over the dielectric layer comprising zirconium oxide, the silver paste being at least initially fluorinated;
   heating at least the fluorinated silver paste;
   forming an electrical connection between the at least one conductive layer and the silver paste, wherein there is no electrical connection between the silver paste and the at least one conductive layer prior to said heating, wherein the heating causes fluorine at least initially provided to the silver paste to form apertures or micro-fractures in the at least one dielectric layer comprising zirconium oxide in forming the electrical connection; and
   wherein the product is a vehicle windshield.

11. The method of claim 10, wherein the silver paste is at least initially fluorinated with tin fluoride, the amount of tin fluoride in the fluorinated silver paste when initially provided on the coating being less than 10% by weight.

12. The method of claim 11, wherein the concentration of fluorine in the tin fluoride is less than 1% by weight.

13. The method of claim 11, wherein the concentration of fluorine in the tin fluoride is about 0.2-0.4% by weight.

14. The method of claim 10, wherein the silver paste is at least initially fluorinated with tin fluoride, the amount of tin fluoride in the fluorinated silver paste when initially provided on the coating being 4-6% by weight.

15. The method of claim 10, wherein there is no detectable fluorine in the silver paste after the heating.

16. The method of claim 10, wherein a temperature required for the heating of the fluorinated silver paste is substantially the same as the temperature would be for an otherwise identical non-fluorinated silver paste.

17. The method of claim 10, wherein at least one said conductive layer comprises Ag.

* * * * *